United States Patent [19]

Koike et al.

[11] 4,399,365
[45] Aug. 16, 1983

[54] ION IMPLANT CHAMBER FOR ION IMPLANTATION SYSTEM

[75] Inventors: Takeshi Koike, Ibaraki; Atsushi Shibata, Katsuta, both of Japan

[73] Assignee: Hitachi, Ltd., Tokyo, Japan

[21] Appl. No.: 243,370

[22] Filed: Mar. 13, 1981

[30] Foreign Application Priority Data

Mar. 13, 1980 [JP] Japan .................................. 55/32493

[51] Int. Cl.³ .............................................. G21G 5/08
[52] U.S. Cl. .................................................. 250/492.2
[58] Field of Search ............... 250/492.2, 442.1, 492.1, 250/400, 492.3; 118/626, 900

[56] References Cited

U.S. PATENT DOCUMENTS 4,274,004 6/1981 Kanai ............................... 250/442.1

OTHER PUBLICATIONS

"High-Speed Disk Scanner for Ion Implantation," D. Balderes, J. R. Kranik, and W. F. Mueller, *IBM Technical Disclosure Bulletin*, vol. 19, No. 3, Aug. 1976, pp. 867-868.

*Primary Examiner*—Alfred E. Smith
*Assistant Examiner*—Jack I. Berman
*Attorney, Agent, or Firm*—Antonelli, Terry & Wands

[57] ABSTRACT

An ion implant chamber for an ion implantation system is disclosed in which first and second discs are arranged concentrically and can be simultaneously rotated, the first disc is provided on a circle thereon with a plurality of wafer receiving recesses each having different diameters at both surfaces of the first disc to prevent a wafer from passing through the recess, and ions impinge upon the wafer through the end of the recess having a smaller diameter; in which when wafers have been loaded in the wafer receiving recesses, the second disc is pressed against the first disc and the wafers are held by the first and second discs, since the second disc is movable in the axial direction thereof; and in which the ion implant chamber can be separated into at least two parts, the first one of the parts can move together with the second disc, and the exchange of wafers is made through a gap between the parts thus separated.

19 Claims, 4 Drawing Figures

ION IMPLANT CHAMBER FOR ION IMPLANTATION SYSTEM

BACKGROUND OF THE INVENTION

The present invention relates to an ion implant chamber for an ion implantation system employed in manufacturing semiconductor devices.

As the demand for semiconductor devices is increased, it becomes very important to effectively implant ions into semiconductor wafers which are used to make the semiconductor devices. Accordingly, various kinds of ion implantation systems are now being developed which are high in productivity and in ion implantation accuracy. For example, a great number of wafers are mounted on a rotating disc at the circumference of a circle thereon, and an ion beam is scanned over the disc in order to implant ions into the wafers. Alternatively, a rotating disc, which is provided with a large number of wafers at the circumference of a circle on the disc, is rotated and simultaneously traversed in the direction of a diameter of the disc, without moving an ion beam incident upon the disc (see U.S. Pat. No. 3,778,626).

The ion implant chambers included in the conventional ion implantation systems have a drawback that it is not easy to load new wafers on the rotating disc and unload wafers ion-implanted from the rotating disc, that is, to handle the wafers.

Further, in a case where the rotating disc is rotated and traversed simultaneously, the conventional ion implant chamber becomes large-sized because a mechanism for traversing the rotating disc is complicated.

Furthermore, the conventional ion implant chamber in which the rotating disc is rotated and traversed simultaneously, cannot cool the wafers loaded on the rotating disc because of the above-mentioned complicated mechanism.

SUMMARY OF THE INVENTION

An object of the present invention is to provide an ion implant chamber for an ion implantation system in which semiconductor wafers can be readily loaded and unloaded.

Another object of the present invention is to provide an ion implant chamber having a simple, compact structure suitable for use in an ion implantation system.

A further object of the present invention is to provide an ion implant chamber for an ion implantation system, in which semiconductor wafers loaded in a rotating disc can be readily cooled.

In order to attain these and other objects, according to the present invention, two rotating discs are provided in a vacuum case, and semiconductor wafers are held between these rotating discs to be ion-implanted.

Further, according to the present invention, the vacuum case is separable, and a part of the vacuum case can move integrally with one of the rotating discs, with respect to the remaining part of the vacuum case.

Furthermore, according to the present invention, a rotating shaft projects outside the vacuum case to be connected to a driving source.

DESCRIPTION OF THE PREFERRED EMBODIMENT

Figure 1:
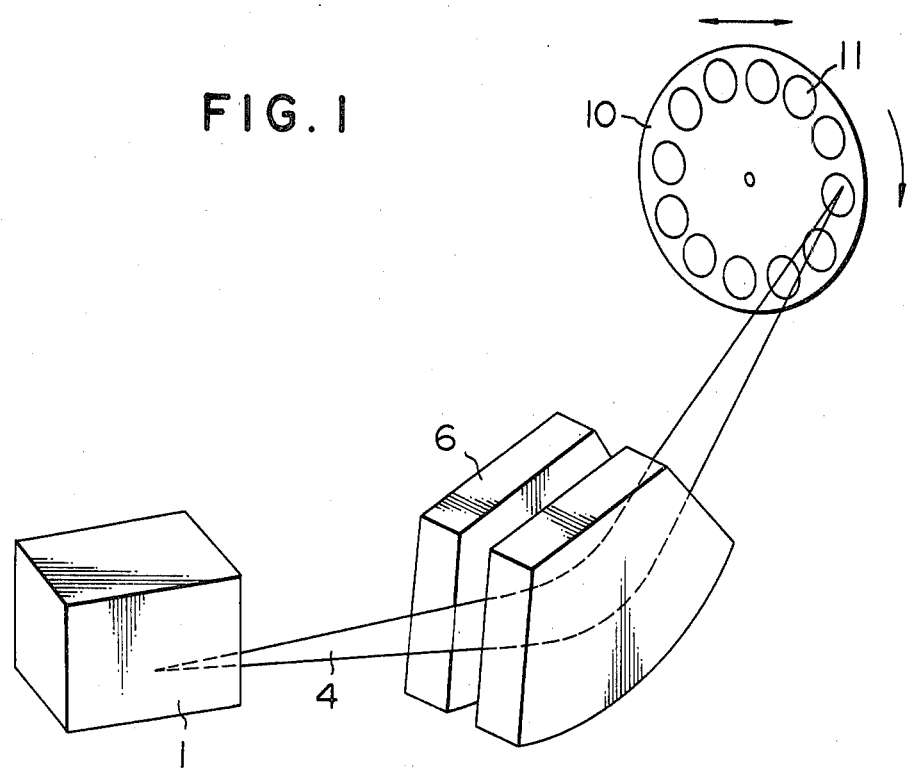
FIG. 1 is a schematic view of an ion implantation system showing a manner that semiconductor wafers loaded on a rotating disc are ion-implanted.

FIG. 1 shows the whole construction of an ion implantation system, and also shows the principle of ion implantation for semiconductor wafers loaded on a rotating disc. Referring to FIG. 1, various materials are ionized in an ion source 1 through microwave plasma discharge techniques. In more detail, gaseous materials are used to produce such ions as $B^+$ and $P^-$ and solid or liquid materials are used to obtain such ions as $Al^+$, $Ga^+$ and $As^-$. The ions thus produced are accelerated and emitted from the ion source 1 as an ion beam 4, which is led into a magnetic field formed by a pair of electromagnets 6. The ion beam 4 is separated by the magnetic field into groups in accordance with mass number. A plurality of wafers 11 are fixed to a disc 10 at a circumferential portion thereof, and the disc 10 conducts a rotational movement in the direction of the arrow and a reciprocating movement in the direction of the arrows in order to uniformly implant ions into the wafers. When the ions are implanted into the wafers, the disc 10 is placed in an ion implant chamber, which is evacuated.

Figure 3:
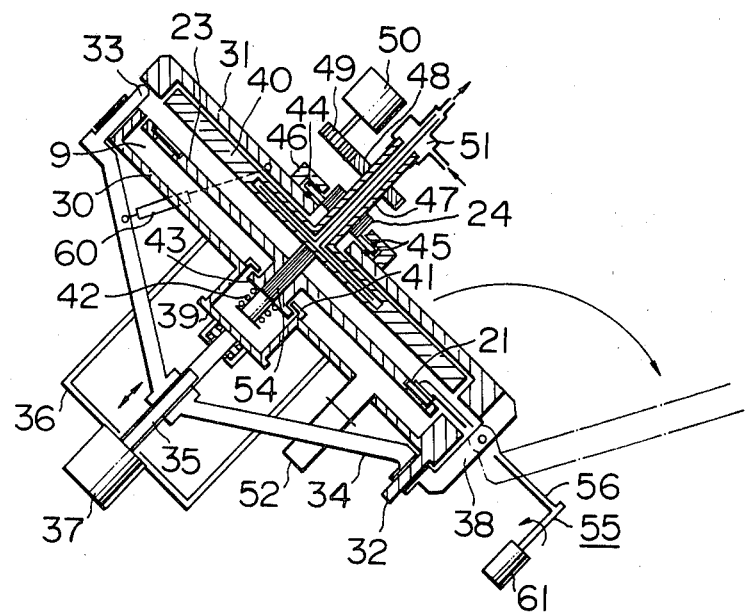
FIG. 3 is a sectional view of the above embodiment, taken along the line III—III of FIG. 2.

Referring to FIG. 3, an ion implant chamber 9 is inclined at about 45 degrees to horizontal, in order to make the ion beam 4 perpendicular to a wafer 21 when the heavy electromagnets 6 (FIG. 1), separating the ion beam 4, are placed slightly above the ground. In this case, the position of the electromagnet 6 is low, and therefore the whole ion implantation system becomes small-sized and inexpensive.

The ion implant chamber 9 includes a chamber base 30 and a chamber cover 31. Guide pins 33 provided on an arm 34 are slidably fitted into the chamber base 30, and a guide pin 32, provided on the chamber base 30, is slidably fitted into a through-hole provided in the arm 34. The arm 34 is provided at a central part thereof with a female screw hole. The female screw hole is threaded onto a feed screw 35 formed on the rotating shaft of a motor 37. The motor 37 is fixed to a supporting frame 36 provided on the chamber base 30. Further, the lower right end of the arm 34 is connected to the chamber cover 31 through a hinge 38.

FIG. 3 shows a state wherein the chamber base 30 is spaced apart from the chamber cover 31 and an arm 56 of a wafer exchange mechanism 55 is inserted into the ion implant chamber 9. The arm 56 is taken out from the chamber 9 and the motor 37 is caused to turn in the reverse direction. Then, the arm 34 falls, and thus respective circumferential portions of the chamber base 30 and the chamber cover 31 are brought into close contact with each other to seal the ion implant chamber 9 hermetically. Therefore, when a vacuum apparatus 52 connected to the chamber base 30 is operated, the ion implant chamber 9 is evacuated and kept under high vacuum.

Figure 4:
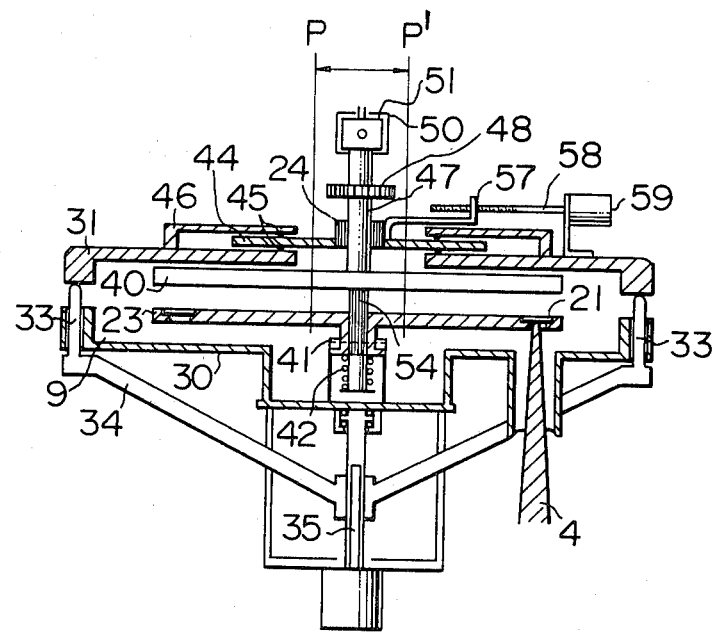
FIG. 4 is another sectional view of the embodiment shown in FIGS. 2 and 3, taken along the line IV—IV of FIG. 2.

The tip of the feed screw 35, turned by the motor 37, is rotatably attached to a center projecting part 39 of the chamber base 30. A rotating disc 23 is coupled to a spline shaft 54 slidably in the axial direction thereof. A coil spring 42 provided in the center projecting part 39 is used to press the rotating disc 23 against a disc 40. FIG. 3 shows a state that a hook plate 41 of the chamber base 30 holds a projection 43 of the rotating disc 23. However, as shown in FIG. 4, the hook plate 41 does not exist in the direction perpendicular to FIG. 3. Accordingly, when the rotating disc 23 is detached from the hook plate 41 by turning the rotating disc 23, the rotating disc 23 is pressed against the disc 40 and is rotated together with the disc 40. The above operation becomes possible by fitting the spline shaft into the rotating disc 23 slidably in the axial direction thereof and by forming a crysanthemum-shaped recess mating with the tip of the spline shaft 54 in a central shaft of that surface of the disc 40 which is opposite to the rotating disc 23.

On the other hand, the disc 40 gives the rotating disc 23 a rotational movement through the spline shaft 54. The disc 40 is connected directly with a shaft 47, which is hermetically supported by a rotary vacuum seal 24 and rotated by a motor 50 through gears 48 and 49. A concentric double water course is provided in the shaft 47 along the axis thereof, and communicates with the inside of the disc 40. The cooling water is introduced into a rotary joint 51 communicating with the outer water path of the double water course, and is discharged from the center tube. The shaft 47 is supported by the chamber cover 31 through a slide flange 44 and a pair of elliptical gaskets 45, and the slide flange 44 is fixed to the rotary vacuum seal 24. The elliptical gaskets 45 are inserted between the chamber cover 31 and a guide 46 fixed to the cover 31 to form a hermetic seal. Such a supporting method is employed in order that the rotating disc 23 can conduct a reciprocating movement integrally with the disc 40 when the above-mentioned ions are implanted into the wafers.

Referring now to FIG. 4, the slide flange 44 is fixed to the rotary vacuum seal 24 for rotatably supporting the shaft 47, and is supported between the chamber cover 31 and the guide 46 through a pair of gaskets 45 each having a form of an ellipse, the major axis of which is parallel to the paper. A feed screw 58 is threaded in a female screw plate 57 which is fixed to the slide flange 44. Accordingly, when the feed screw 58 is turned in the normal and reverse directions by means of a motor 59, the rotating disc 23 and the disc 40 which are kept in close contact with each other, can conduct a reciprocating motion between points P and P'.

When the wafers 21 are set in the rotating disc 23, the wafers 21 are only loaded in wafer receiving recesses provided in the rotating disc 23, and therefore the loading of the wafers is very simple. The wafer receiving recess is a through-hole penetrating the rotating disc 23. The diameter of the wafer receiving recess on the wafer handling side is greater than the outer diameter of the wafer, and the diameter of the hole on the other side is smaller than the outer diameter of the wafer. The rotating disc 23 is inclined so that the ion beam 4 is perpendicular to the rotating disc 23, and therefore the wafers 21 do not fall. The ion beam 4, as shown in FIG. 4, reaches the wafers 21 through a window for the wafer receiving recesses. As mentioned above, the ion beam 4 is held stationary and the rotating disc 23 is rotated and traversed to implant ions uniformly into the wafers 21.

Figure 2:
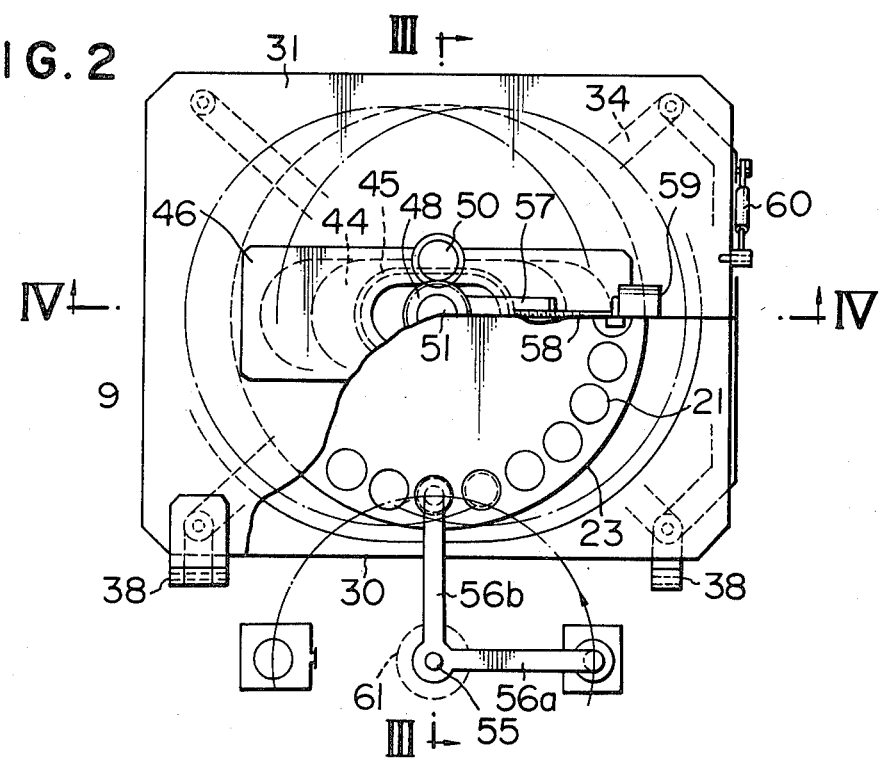
FIG. 2 is a plan view of an embodiment of an ion implant chamber according to the present invention, taken on an opposite side to that side where semiconductor wafers are ion-implanted.

FIG. 2 shows the ion implant chamber viewed from the rear thereof, and is a partially cutaway view for showing the arrangement of the wafers 21 and the wafer exchange mechanism 55. Referring to FIG. 2, the rectangular guide 46 is fixed to a central portion of the chamber cover 31, and the shaft provided with the gear 48 and the rotary joint 51 (for the cooling water) protrudes from the guide 46. The motor 50 drives the gear 48. The motor 59 causes the shaft 47 to conduct the reciprocating movement in order to scan the wafers 21 in the rotating disc 23 with respect to the ion beam 4. Further, a hydraulic cylinder 60 provided at the right edge of the chamber cover 31 is a driving source, which is employed to open the chamber cover 31 while using the hinge 38 as a fulcrum point, as indicated by a dot-dash line in FIG. 3, when it is required to mount another kind of rotating disc in place of the rotating disc 23.

A large number of wafers 21 are set in a circumferential portion of the rotating disc 23 in such a manner as forming a circular arrangement. When the wafers 21 are loaded in and unloaded from the rotating disc 23, the chamber base 30 and the chamber cover 31 are spaced apart from each other by about 50 mm and the arm 56 of the wafer exchange mechanism 55 is inserted between the chamber base 30 and the chamber cover 31, as shown in FIG. 3. The arm 56 having the form of the character "L", as shown in FIG. 2, is provided at an axial portion thereof with a vacuum path, and is further provided at the tips thereof with pickups. The pickup of a traverse arm 56a is made adhere to a new wafer to be ion-implanted, and the pickup of a longitudinal arm 56b is made adhere to a wafer having been ion-implanted. Then, the arm 56 is rotated 90 degrees by means of the motor 61, and thus the exchange of wafers can be made with one action. Next, the rotating disc 23 is rotated by an angle corresponding to a pitch between adjacent wafers, and then above-mentioned exchange operation is performed. Thus, the automatic exchange of wafers can be carried out.

In the foregoing description, explanation has been made on a case where new wafers are loaded in the same rotating disc 23 in place of old ones in order to be ion-implanted. However, when it is required to implant ions into wafers having an outer diameter different from that of the previous wafers, the rotating disc 23 is replaced by another rotating disc. Further, when the inside of the ion implant chamber 9 is made clean, and when repairs are made on the ion implant chamber 9, it is required to keep the chamber cover 31 open. In this case, the hydraulic cylinder 60 shown in FIGS. 2 and 3 is operated, and the cover 31 is turned in the direction of the arrow using the hinge 38 as the fulcrum point. Further, the rotating disc 23 which is held by the chamber base 30, is detached from the base 30 by rotating the disc 23 about 90 degrees, and thus can be readily replaced by another rotating disc.

The above-mentioned embodiment of an ion implant chamber according to the present invention has various advantages such as mentioned below.

The rotating disc is provided with only the wafer receiving recesses, and is not required to include conventional cassettes and springs. Accordingly, the loading of wafers in the rotating disc is simplified, and thus the automatic exchange of wafers can be readily conducted.

Further, the wafers can be handled in that surface of the rotating disc which is opposite to the surface exposed to the ion beam. Accordingly, the ion implanted surface of each wafer is not injured.

The ion implant chamber includes only the rotating disc and the disc therein, and therefore is compact in structure and small in volume. Thus, a time necessary to evacuate the ion implant chamber is considerably reduced. This fact and the automatic exchange of wafers greatly improve the wafer processing capability of the ion implantation system. The above-mentioned effect results from the structure that the shaft of the disc for rotating and traversing the rotating disc through the spline shaft protrudes from the ion implant chamber and is supported by the chamber cover rotatably and movably.

As mentioned above, since the shaft of the disc is protruded from the ion implant chamber, the cooling water can be introduced into the above shaft in order to cool the disc. Thus, a temperature rise in that wafer which is being ion-implanted, is reduced, and therefore the accuracy of ion-implantation is improved.

The ion implant chamber has such various functions as being hermetically sealed when ions are implanted into the wafers, spacing the chamber cover from the chamber base by about 50 mm to insert therebetween the arm of the wafer exchange mechanism when the wafer is replaced by a new one, and keeping the chamber cover open when the rotating disc is replaced by another one. Accordingly, the wafer processing capability of the ion implantation system is enhanced and moreover it is easy to operate the ion implant chamber.

The electromagnet is installed at a low position and the ion beam impinges upon the wafers in the direction inclined at about 45 degrees to horizontal. Accordingly, the ion beam generating part becomes small-sized and inexpensive, and therefore the whole ion implantation system can be made small-sized.

We claim:

1. An ion implant chamber for an ion implantation system for implanting ion emitted from an ion source into a wafer, comprising:
   a vacuum case capable of being hermetically sealed;
   a first rotating disc supported in said vacuum case;
   a second rotating disc arranged coaxially with said first rotating disc, said second rotating disc being able to hold a wafer by keeping said second rotating disc in close contact with said first rotating disc; and
   a driving source for rotating said first and second rotating discs.

2. An ion implant chamber according to claim 1, wherein said first and second rotating discs are coupled to each other by a spline shaft and are slidable in the direction of the rotary axis of said spline shaft.

3. An ion implant according to claim 2, wherein said first rotating disc is provided with a projection for holding said first rotating disc by said vacuum base, a spring is provided to press said projection against said vacuum case, and wherein, upon rotation of said first rotating dics, said projection is detached from said vacuum case so as to enable said first rotating disc to be pressed against said second rotating disc.

4. An ion implant chamber according to claim 1, wherein said first rotating disc is provided with a recess for receiving a wafer, and ions are implanted into an opposite surface of a wafer, which is loaded in said recess, to the surface kept in contact with said second rotating disc.

5. An ion implant chamber according to claim 4, wherein said second rotating disc is movable with respect to said first rotating disc, and said wafer can be handled through a gap formed between said first and second rotating discs.

6. An ion implant chamber according to claim 4, wherein said wafer receiving recess has at one surface of said first rotating disc a diameter greater than an outer diameter of said wafer loaded in said wafer receiving recess, and has at the other surface of said first rotating disc a diameter smaller than said outer diameter of said wafer, and wherein said wafer is set in said wafer receiving recess on the side having said greater recess diameter and ions are implanted in said wafer on the side having said smaller recess diameter.

7. An ion implant chamber for an ion implantation system for implanting ions emitted from an ion source into a target, comprising:
   a vacuum case capable of being hermetically sealed, said vacuum case being separable into at least two parts;
   first and second rotating discs provided in said vacuum case for holding said target, one of said first and second rotating discs being moved integrally with said vacuum case to break vacuum conditions; and
   a driving source for driving said first and second rotating discs.

8. An ion implant chamber according to claim 7, wherein said target is loaded in a recess provided in at least one of said first and second rotating discs, and ions are implanted into said target on an opposite side to a side where said first and second rotating discs are brought into contact with each other.

9. An ion implant chamber for an ion implantation system for implanting ions into a target, the ion implant chamber comprising:
   a vacuum case;
   a rotating disc provided in said vacuum case for holding said target; and
   a driving source for rotating a rotary shaft of said rotating disc, said rotary shaft protruding outside said vacuum case, said rotary shaft and said rotating disc are hollow, and a rotary joint is coupled to said rotary shaft protruding outside said vacuum case to introduce cooling water into said rotating disc through said rotary joint.

10. A wafer supporting apparatus for use in an ion implantation system, the wafer supporting apparatus comprising a chamber base having an opening through which ions pass, a chamber cover capable of being coupled to and decoupled from the chamber base, a chamber cover forming an ion implantation chamber in cooperation with the chamber base upon being coupled thereto, a first rotating disc rotatably arranged within the ion implantation chamber, a second rotating disc arranged on the opposite side of the first rotating disc to the opening of the chamber base within the ion implantation chamber so as to be capable of rotating together with the first rotating disc and being contacted with and spaced apart from the first rotating disc, and means for rotating the first and second rotating discs, the first rotating disc being provided with a plurality of apertures through which the ions pass when the first rotating disc rotates, the first and second rotating disc holding, upon being contacted with each other, a plurality of wafers therebetween so as to implant the ions passed through the apertures into the wafers.

11. A wafer supporting apparatus as claimed in claim 10, further comprising a spline shaft fixed to the second rotating disc, the first rotating disc being coupled to the spline shaft so as to be slidable in a direction of the rotary axis of the spline shaft.

12. A wafer supporting apparatus as claimed in claim 10, further comprising a spring for resiliently pressing the first rotating disc against the second rotating disc.

13. A wafer supporting apparatus as claimed in claim 10, wherein the first rotating disc is provided with recesses for receiving the wafers.

14. A wafer supporting apparatus according to claim 10, wherein the second rotating disc is rotatably supported by the chamber cover, and wherein means are provided for spacing the chamber cover from the chamber base so as to form a gap between the first and second rotating discs so as to enable an exchange of wafers through the gap.

15. A wafer supporting apparatus as claimed in claim 10, wherein each of the recesses has on a side of the second rotating disc a diameter greater than an outer diameter of the wafers and has on an opposite side of the recesses to the second rotating disc a diameter smaller than an outer diameter of the wafers, the wafers being set in recesses on the side having the greater diameter.

16. A wafer supporting apparatus as claimed in claim 10, wherein the ion implantation chamber is maintained in a vacuum, and the second rotating disc is moved integrally with the chamber cover when the latter is spaced apart from the chamber base so as to break the vacuum of the ion implantation chamber.

17. A wafer supporting apparatus as claimed in claim 10, further comprising a rotating shaft protruding outside the ion implantation chamber for rotating the second rotating disc, the rotating shaft and the second rotating disc are hollow so as to be capable of introducing cooling water into the second rotating disc through the rotating shaft and a rotary vacuum seal through which the rotating shaft is supported by the chamber cover.

18. A wafer supporting apparatus as claimed in claim 17, further comprising a slide flange to which the rotary vacuum seal is fixed, the slide flange being interposed between the chamber cover and a guide fixed thereto, and means for vacuum-sealing a gap between the guide and the side flange and a gap between the side flange and the chamber cover, respectively.

19. A wafer supporting apparatus as claimed in claim 18, further comprising means for causing the side flange to execute a linear motion in a substantially perpendicular plane to a rotary axis of the rotating shaft.

* * * * *